(12) United States Patent
Jeon et al.

(10) Patent No.: US 7,547,942 B2
(45) Date of Patent: Jun. 16, 2009

(54) NONVOLATILE MEMORY DEVICES AND METHODS OF FABRICATING THE SAME

(75) Inventors: Sang-Hun Jeon, Yongin-si (KR);
Chang-Seok Kang, Seongnam-si (KR);
Jung-Dal Choi, Suwon-si (KR);
Jin-Taek Park, Suwon-si (KR);
Woong-Hee Sohn, Seoul (KR);
Won-Seok Jung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/709,816

(22) Filed: Feb. 23, 2007

(65) Prior Publication Data

US 2008/0105918 A1 May 8, 2008

(30) Foreign Application Priority Data

Nov. 6, 2006 (KR) .................... 10-2006-0109128

(51) Int. Cl.
*H01L 21/00* (2006.01)
(52) U.S. Cl. .................. 257/324; 257/326; 257/315
(58) Field of Classification Search .................. 257/314, 257/E29.128, E29.309, 315, 324, 326
See application file for complete search history.

(56) References Cited

U.S. PATENT DOCUMENTS

| | | | | |
|---|---|---|---|---|
| 6,025,620 A | * | 2/2000 | Kimura et al. | 257/296 |
| 6,037,625 A | * | 3/2000 | Matsubara et al. | 257/315 |
| 6,133,096 A | * | 10/2000 | Su et al. | 438/264 |
| 6,239,465 B1 | | 5/2001 | Nakagawa | |
| 6,242,311 B1 | * | 6/2001 | Ahn | 438/275 |
| 6,268,255 B1 | * | 7/2001 | Besser et al. | 438/303 |
| 6,297,094 B1 | * | 10/2001 | Matsubara et al. | 438/257 |
| 6,992,348 B2 | | 1/2006 | Kleint et al. | |
| 7,071,517 B2 | * | 7/2006 | Kim et al. | 257/382 |
| 2002/0043683 A1 | | 4/2002 | Nakagawa et al. | |
| 2005/0239248 A1 | | 10/2005 | Lee | |
| 2006/0261398 A1 | * | 11/2006 | Lee | 257/314 |
| 2007/0057328 A1 | * | 3/2007 | Taniguchi et al. | 257/368 |
| 2007/0117295 A1 | * | 5/2007 | Yoon | 438/197 |
| 2008/0079056 A1 | * | 4/2008 | Cha et al. | 257/314 |
| 2008/0105918 A1 | * | 5/2008 | Jeon et al. | 257/324 |
| 2008/0237700 A1 | * | 10/2008 | Kim et al. | 257/326 |

FOREIGN PATENT DOCUMENTS

| | | |
|---|---|---|
| JP | 2002-110824 | 4/2004 |
| KR | 10-2003-0042678 A | 6/2003 |
| KR | 10-2003-0092997 A | 12/2003 |
| KR | 10-2005-0015975 | 2/2005 |
| KR | 10-2005-0102487 A | 10/2005 |
| KR | 10-2005-0106280 | 11/2005 |

* cited by examiner

*Primary Examiner*—Laura M Menz
(74) *Attorney, Agent, or Firm*—Lee & Morse, P.C.

(57) ABSTRACT

A nonvolatile memory device includes a semiconductor substrate including a cell region and a peripheral circuit region, a cell gate on the cell region, and a peripheral circuit gate on the peripheral circuit region, wherein the cell gate includes a charge storage insulating layer on the semiconductor substrate, a gate electrode on the charge storage insulating layer, and a conductive layer on the gate electrode, and the peripheral circuit gate includes a gate insulating layer on the semiconductor substrate, a semiconductor layer on the gate insulating layer, an ohmic layer on the semiconductor layer, and the conductive layer on the ohmic layer.

11 Claims, 9 Drawing Sheets

Fig. 1
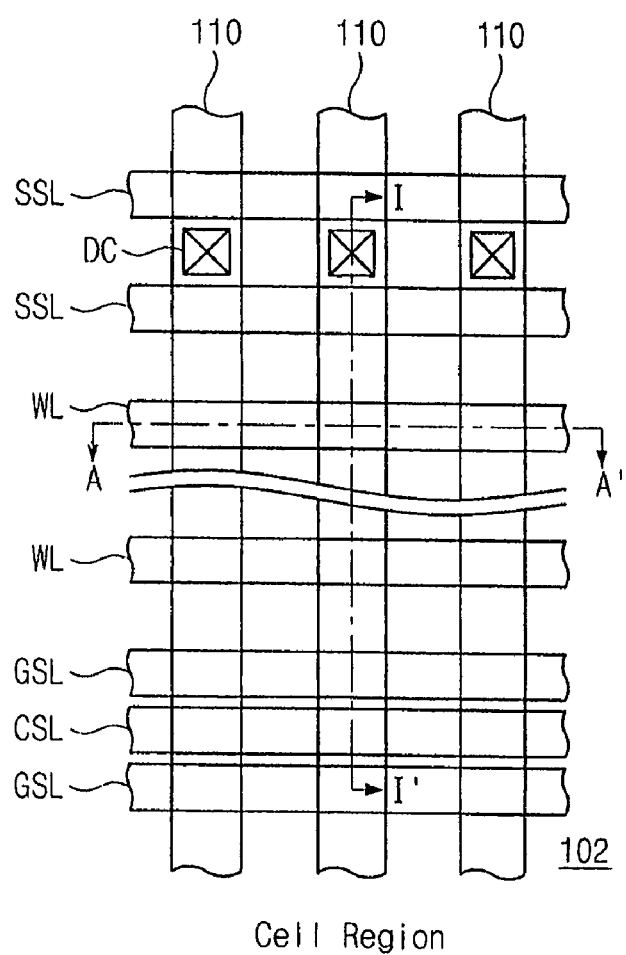
Cell Region
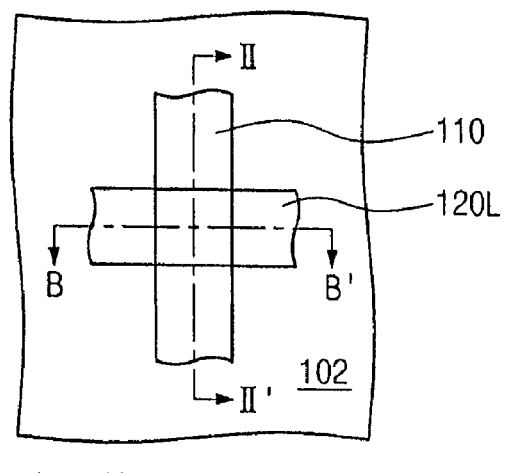
Low Voltage Region
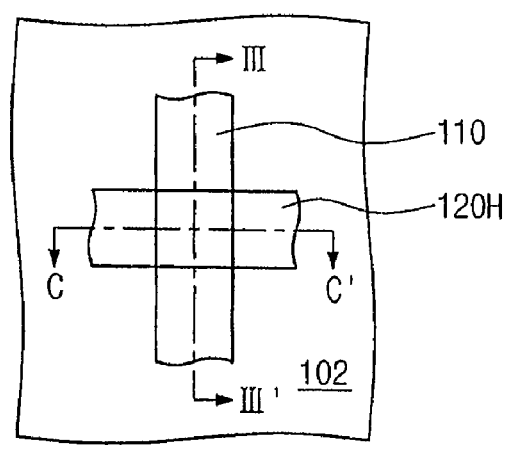
High Voltage Region

NONVOLATILE MEMORY DEVICES AND METHODS OF FABRICATING THE SAME

BACKGROUND OF THE INVENTION

1. Field of the Invention

The present invention disclosed herein relates to a semiconductor devices and methods of fabricating semiconductor devices. More particularly, the invention relates to nonvolatile memory devices and methods of fabricating nonvolatile memory devices.

2. Description of the Related Art

As semiconductor devices are becoming more integrated, line-widths of patterns constituting the semiconductor devices are decreasing. The patterns may be conductive patterns including gate patterns and lines. The reduction of linewidths of the conductive patterns leads to an increase in electrical resistance and resistance-capacitance (RC) delay. Accordingly, technology has been proposed to form the gate patterns with a metallic material having a low specific resistance. For example, the gate patterns may be formed of tungsten (W) having a specific resistance of $5.5\times10^{-8}$ $\Omega$m. Meanwhile, tungsten silicide (WSix) including tungsten has a specific resistance in the range of $3\times10^{-7}$ $\Omega$m to $7\times10^{-7}$ $\Omega$m. Polysilicon has a specific resistance of $10^{-5}$ $\Omega$m and thus, the specific resistance of the tungsten silicide is several tens of times smaller than that of polysilicon.

Although tungsten has a low specific resistance, reliability of the gate insulating layer is degraded when a tungsten layer is directly in contact with a gate insulating layer. Therefore, a semiconductor layer may be interposed between the tungsten layer and the gate insulating layer. The semiconductor layer may be a polysilicon layer. In addition, a barrier metal layer may be disposed between the tungsten layer and the semiconductor layer. The barrier metal layer may play a role in reducing and/or preventing the interfacial reaction and mutual diffusion between the semiconductor layer and the tungsten layer. Generally, the barrier metal layer may be a metal nitride layer including a tungsten nitride (WN) layer and a titanium nitride (TiN) layer. However, when the metal nitride layer is directly in contact with the semiconductor layer, the contact resistance may be increased, which may lead to considerable problems in operational characteristics of the semiconductor device.

SUMMARY OF THE INVENTION

The present invention is therefore directed to nonvolatile memory devices and methods of fabricating nonvolatile memory devices, which substantially overcome one or more of the problems due to the limitations and disadvantages of the related art.

It is therefore a feature of an embodiment of the present invention to provide nonvolatile memory devices that withstand their operational characteristics despite including elements having relatively thin line-widths, and method of fabricating such devices.

At least one of the above and other features and advantages of the present invention may be realized by providing a nonvolatile memory device, including a semiconductor substrate including a cell region and a peripheral circuit region, a cell gate on the cell region, and a peripheral circuit gate on the peripheral circuit region, wherein the cell gate includes a charge storage insulating layer on the semiconductor substrate, a gate electrode on the charge storage insulating layer, and a conductive layer on the gate electrode, and the peripheral circuit gate includes a gate insulating layer on the semiconductor substrate, a semiconductor layer on the gate insulating layer, an ohmic layer on the semiconductor layer, and the conductive layer on the ohmic layer.

The charge storage insulating layer may include a tunnel insulating layer, a charge storage layer and a blocking insulating layer. The charge storage layer may include at least one of silicon nitride ($Si_3N_4$), nano crystalline silicon, nano crystalline silicon germanium, nano crystalline metal, aluminum oxide ($Al_2O_3$), hafnium oxide ($HfO_2$), hafnium aluminate (HfAlO), and/or hafnium silicon oxynitride (HfSiON). The blocking insulating layer may include a material having a dielectric constant greater than that of the tunnel insulating layer. The gate electrode may include a metal having a work function greater than 4 eV. The gate electrode may include at least one of tantalum nitride (TaN), tantalum (Ta), ruthenium (Ru), tungsten nitride (WN), tungsten (W), titanium (Ti), titanium nitride (TiN), tantalum titanium (TaTi), tantalum platinum (TaPt), tantalum silicon nitride (TaSiN), hafnium nitride (HfN), titanium aluminum nitride ($Ti_2AlN$), molybdenum (Mo), and/or platinum (Pt).

The semiconductor layer may include a polysilicon layer. The ohmic layer may include a metal silicide layer. The conductive layer may include at least one of a metal nitride layer and a tungsten nitride layer with a tungsten layer thereon. The memory device may include a sidewall spacer on a sidewall of the peripheral circuit gate. The sidewall spacer may include at least one of a silicon oxide layer and a silicon nitride layer.

At least one of the above and other features and advantages of the present invention may be separately realized by providing a method of fabricating a nonvolatile memory device, the method including providing a semiconductor substrate including a cell region and a peripheral region, forming a peripheral circuit gate pattern in the peripheral circuit region, and forming a preliminary cell gate pattern in the cell region, wherein forming the peripheral circuit gate pattern includes forming an insulating layer on the semiconductor substrate, a semiconductor layer on the insulating layer, an ohmic layer on the semiconductor pattern, and a first mask layer on the ohmic layer, and forming the cell gate pattern includes forming a charge storage insulating layer, a conductive gate layer on the preliminary charge storage insulating layer, and a second mask layer on the conductive gate layer.

Forming the peripheral circuit gate pattern may include forming a sidewall spacer on a sidewall of the peripheral circuit gate pattern. The sidewall spacer may include an oxygen diffusion barrier layer for suppressing or preventing oxygen from diffusing into the peripheral circuit gate pattern. Forming the sidewall spacer may include forming a silicon oxide layer on the cell region and the peripheral circuit gate pattern, forming a silicon nitride layer on the silicon oxide layer, and anisotropically etching the silicon oxide layer and the silicon nitride layer.

Forming the peripheral circuit gate pattern may further include removing a portion of the ohmic layer, the semiconductor layer and the insulating layer on the cell region using the first mask pattern as an etch mask. Forming the cell gate pattern may include forming the charge storage insulating layer and the conductive gate layer and the second mask pattern after removing portions of the ohmic layer, the semiconductor layer and the insulating layer, and patterning the conductive gate layer and the charge storage insulating layer using the second mask pattern as an etch mask, wherein the second mask pattern covers the cell region.

The method may further include removing the first and second mask patterns to expose remaining portions of the ohmic layer and the conductive gate layer, and forming a conductive layer on the exposed ohmic layer and the conductive gate layer. The conductive layer may include a tungsten nitride layer and a tungsten layer on the tungsten nitride layer.

The method may further include patterning the peripheral circuit gate pattern, the cell gate pattern and the conductive layer such that the peripheral circuit gate pattern includes a gate insulating pattern, a semiconductor pattern on the gate insulating pattern, an ohmic pattern on the semiconductor pattern and a conductive pattern on the ohmic pattern, and the cell gate pattern includes a charge storage insulating pattern, a gate electrode on the charge storage insulating pattern and a corresponding conductive pattern on the gate electrode.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 1 illustrates a plan view of exemplary embodiments of a nonvolatile memory device employing one or more aspects of the present invention;

DETAILED DESCRIPTION OF THE INVENTION

Figure 2:
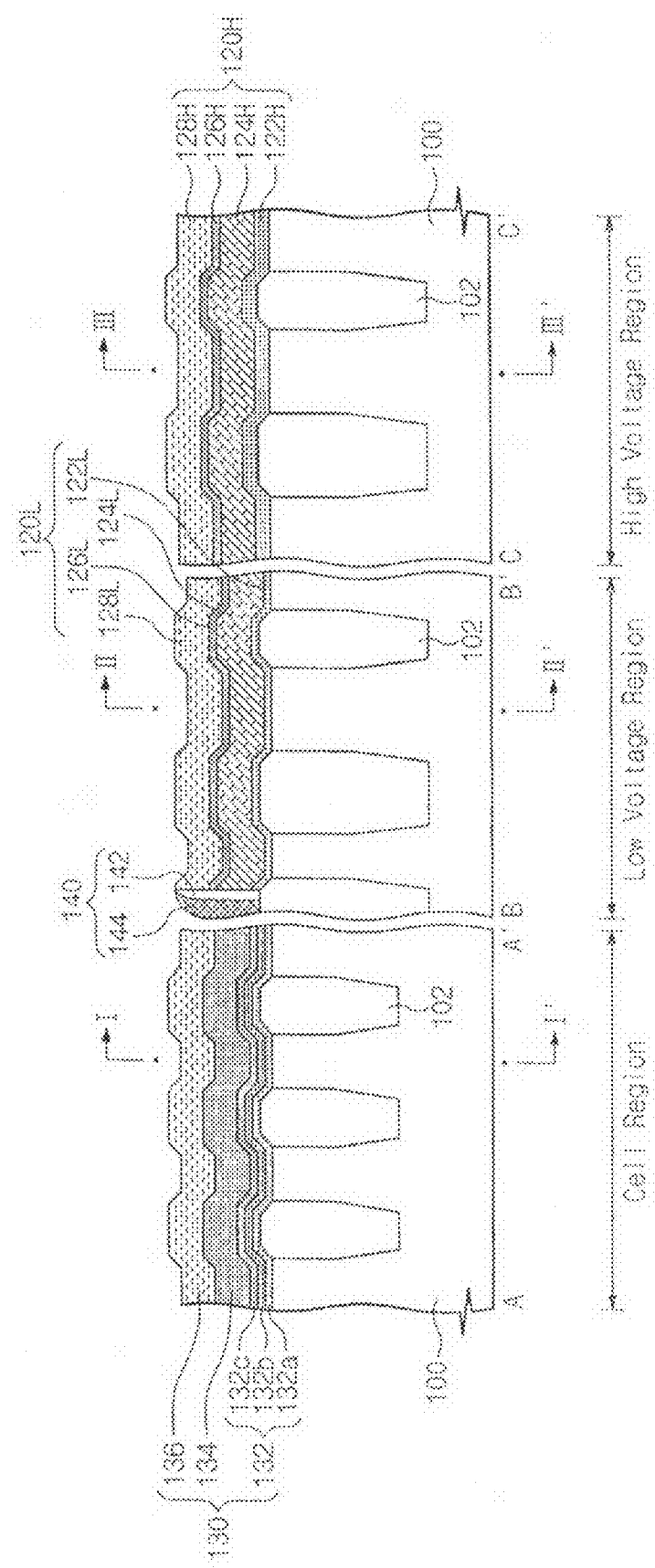
FIG. 2 illustrates cross-sectional views of the nonvolatile memory device illustrated in FIG. 1, taken along lines A-A', B-B' and C-C' of FIG. 1.

Korean Patent Application No. 10-2006-109128, filed on Nov. 6, 2006, in the Korean Intellectual Property Office, and entitled: "Nonvolatile Memory Device and Method of Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout the specification.

Hereinafter, exemplary embodiments of the present invention will be described with reference to the accompanying drawings. In particular, exemplary embodiments of nonvolatile memory devices employing one or more aspects of the invention will be described below with reference to FIGS. 1 through 9.

Figure 3:
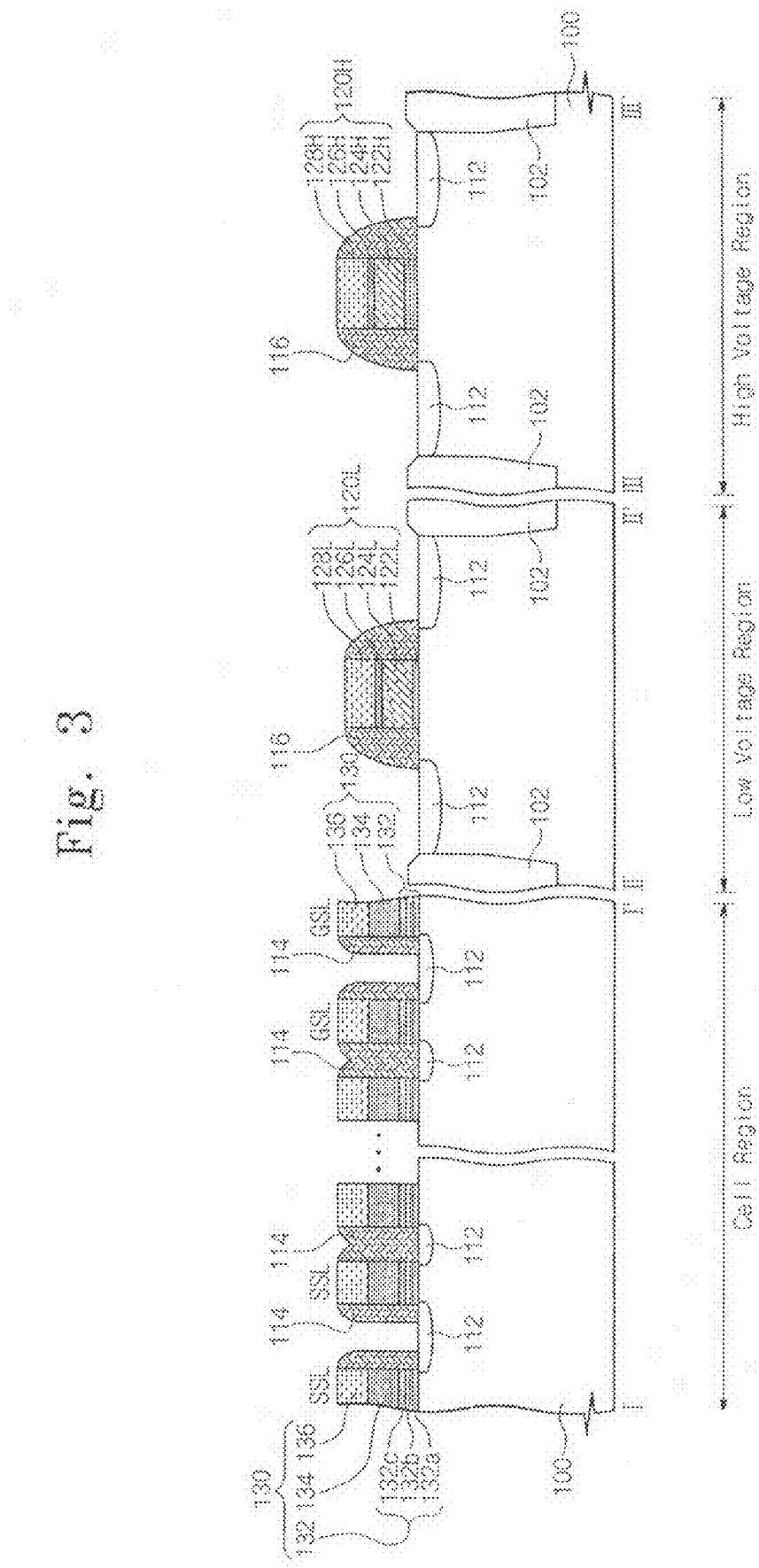
FIG. 3 illustrates cross-sectional views of the nonvolatile memory device illustrated in FIG. 1, taken along lines I-I', II-II' and III-III' of FIG. 2.

FIG. 1 illustrates a plan view of an exemplary embodiment of a nonvolatile memory device employing one or more aspects of the present invention. FIG. 2 illustrates cross-sectional views of the nonvolatile memory device illustrated in FIG. 1, taken along lines A-A', B-B' and C-C' of FIG. 1. FIG. 3 illustrates cross-sectional views of the nonvolatile memory device illustrated in FIG. 1, taken along lines I-I', II-II' and III-III' of FIG. 2.

Referring to FIGS. 1 through 3, a nonvolatile memory device may include a semiconductor substrate 100 including a cell region and a peripheral region. The semiconductor substrate 100 may include active region(s) 110 defined by a device isolation layer 102. The peripheral circuit region may include a high voltage region for high voltage operation, and a low voltage region for low voltage operation.

One, some or all of the peripheral gates 120L, 120H may be disposed in the peripheral circuit region, and cell gate(s) 130 may be provided in the cell region. A low voltage transistor of the low voltage region and a high voltage transistor of the high voltage region may have respective functions. Thus, gate structures of the low voltage transistor(s) and high transistor (s) may have different characteristics, e.g., a thickness of an insulating layer of the low voltage transistor(s) may be different from a thickness of an insulating layer of the high voltage transistor(s), a structure of a source/drain region of the low voltage transistor(s) may be different from a thickness of an insulating layer of the high voltage transistor(s).

The peripheral gate(s) may include a low voltage gate 120L for the low voltage transistor and a high voltage gate 120H for the high voltage transistor. The low voltage gate 120L may include a low voltage gate insulating layer 122L on the semiconductor substrate 100, a semiconductor layer 124L on the low voltage gate insulating layer 122L, an ohmic layer 126L on the semiconductor layer 124L, and a conductive layer 128L on the ohmic layer 126L. The high voltage gate 120H may include a high voltage gate insulating layer 122H on the semiconductor substrate 100, a semiconductor layer 124H on the high voltage gate insulating layer 122H, an ohmic layer 126H on the semiconductor layer 124H, and a conductive layer 128H on the ohmic layer 126H.

The semiconductor layer 124L of the low voltage gate 120L may be substantially similar and/or identical to the semiconductor layer 124H of the high voltage gate 120H. The ohmic layer 126L of the low voltage gate 120L may be substantially similar and/or identical to the ohmic layer 126H of the high voltage gate 120H. The conductive layer 128L of the low voltage gate 120L may be substantially similar and/or identical to the conductive layer 128H of the high voltage gate 120H. The low voltage gate insulating layer 122L may have a thickness that is smaller than a thickness of the high voltage gate insulating layer 122H. The low and high voltage gate insulating layers 122L and 122H may include, e.g., thermal oxide.

One, some or all of the cell gates 130 may include a charge storage insulating layer 132 on the semiconductor substrate 100, a gate electrode 134 on the charge storage insulating layer 132, and a conductive layer 136 on the gate electrode 134. The cell gate(s) 130 may correspond to a memory cell gate, a ground selection gate and a source selection gate. In some embodiments of the invention, the memory cell gate, the ground selection gate and the source selection gate may have a same structure. However, structures the cell gates 130, e.g., memory cell gates, are not limited to the above-described structure. Thus, e.g., memory cell gates may have various different structures.

The semiconductor substrate 100 may include a single crystalline silicon layer, a silicon on insulator (SOI), a silicon layer on a silicon germanium (SiGe) layer, a silicon single crystalline layer on an insulating layer, and/or a polysilicon layer on an insulating layer.

The charge storage insulating layer 132 may include, e.g., a tunnel insulating layer 132a, a charge storage layer 132b, and a blocking insulating layer 132c. The tunnel insulating layer 132a and the blocking insulating layer 132c may include, e.g., silicon oxide, silicon nitride, aluminum oxide ($Al_2O_3$), hafnium aluminate (HfAlO), HfAlON, hafnium silicate (HfSiO), and/or hafnium silicon oxynitride (HfSiON). In some embodiments of the invention, the blocking insulating layer 132c may include, e.g., an insulating layer of which a dielectric constant is greater than that of a highest-k insulating layer of the tunnel insulating layer 132a. In some embodiments of the invention, the blocking insulating layer 132c may have a thickness that is greater than a thickness of the highest-k insulating layer of the tunnel insulating layer 132a. The charge storage layer 132b may include, e.g., polysilicon, silicon nitride ($Si_3N_4$), nano crystalline silicon, nano crystalline silicon germanium, nano crystalline metal, aluminum oxide ($Al_2O_3$), hafnium oxide ($HfO_2$), hafnium aluminate (HfAlO), and/or hafnium silicon oxynitride (HfSiON).

The gate electrode 134 may include, e.g., a material having a work function greater than 4 eV. A potential barrier between the gate electrode 134 and the charge storage insulating layer 132 may be increased. As the potential barrier between the blocking insulating layer 132c and the gate electrode 134 is increased, tunneling of charges may be decreased between the gate electrode 134 and the charge storage layer 132b. For example, the gate electrode 134 may include semiconductor doped with p-type dopant, tantalum nitride (TaN), tantalum (Ta), ruthenium (Ru), tungsten nitride (WN), tungsten (W), titanium (Ti), titanium nitride (TiN), tantalum titanium (TaTi), tantalum platinum (TaPt), tantalum silicon nitride (TaSiN), hafnium nitride (HfN), titanium aluminum nitride ($Ti_2AlN$), molybdenum (Mo), and/or platinum (Pt).

The conductive layer 136 of the cell gate 130 may include a lower conductive layer (not shown) and an upper conductive layer (not shown). The lower conductive layer may include, e.g., metallic nitride, conductive metallic oxide and/or metallic nitride having Si or Al. The metallic nitride may include, e.g., TaN, TiN and/or WN. The metallic oxide may include, e.g., $IrO_2$ and/or $RuO_2$. The metallic nitride having Si or Al may include, e.g., TiSiN, TaSiN, TaAlN and/or TiAlN. The upper conductive layer may include, e.g., tungsten (W), copper (Cu), aluminum (Al), gold (Au), silver (Ag), platinum (Pt) and/or palladium (Pd). In some embodiments of the invention, the lower and upper conductive layers of the conductive layer 136 may be, e.g., a tungsten nitride layer and a tungsten layer, respectively.

The semiconductor layers 124L and 124H of the peripheral gates 120L, 120H may be, e.g., a polysilicon layer. The ohmic layers 126L and 126H may be, e.g., a metallic silicide layer. The ohmic layers 126L and 126H may include, e.g., WSi, TiSi, TaSi and/or CoSi. In some embodiments of the invention, the conductive layers 128L and 128H on the ohmic layers 126L and 126H may include the same material as the conductive layer 136 of the cell gate(s) 130.

In some embodiments of the invention, the nonvolatile memory device may further include a sidewall insulating layer 140 on a sidewall of an edge of the peripheral gate 120L and 120H. The sidewall insulating layer 140 may include, e.g., a silicon oxide layer 142 and/or a silicon nitride layer 144. Although FIG. 2 shows that the sidewall insulating layer 140 is provided on a sidewall of an edge of the low voltage gate 120L, embodiments of the present invention are not limited to this. In some embodiments of the invention, e.g., the sidewall insulating layer 140 may be formed between the cell region and the peripheral region. For example, the sidewall insulating layer 140 may be provided on a sidewall of an edge of the high voltage gate 120H.

Referring again to FIGS. 1 through 3, string selection line(s) SSL and ground selection line(s) GSL may be arranged in parallel such that they cross over the active region 110. A plurality of word lines WL may be disposed between the string selection line SSL and the ground selection line GSL. The word lines WL may be arranged parallel to each other such that they also cross over the active region 110. A contact plug DC electrically connected to a bit line (not shown) may be provided between neighboring string selection lines SSLs. A common source line CSL may be disposed between neighboring ground selection lines GSLs. Impurity regions 112 of source/drain regions may be provided in the active region 110 adjacent to the string selection line SSL, the plurality of word lines WL and the ground selection line GSL. Sidewall spacers 114 may be provided on sidewalls of the cell gates 130 of the string selection line SSL, the plurality of word lines WL and the ground selection line GSL. Sidewall spacers 116 may be provided on sidewalls of gates 120L, 120H of the peripheral circuit region. The impurity regions 112 of the source/drain regions may be provided in the semiconductor substrate 100 at both sides of the gate 120L, 120H of the peripheral circuit region. The impurity regions 112 may have different structures in the low voltage region and the high voltage region, respectively.

FIGS. 4 through 9 illustrate cross-sectional views of stages in an exemplary method of fabricating a nonvolatile memory device according to one or more aspects the present invention, taken along lines A-A', B-B' and C-C' of FIG. 1.

Figure 4:
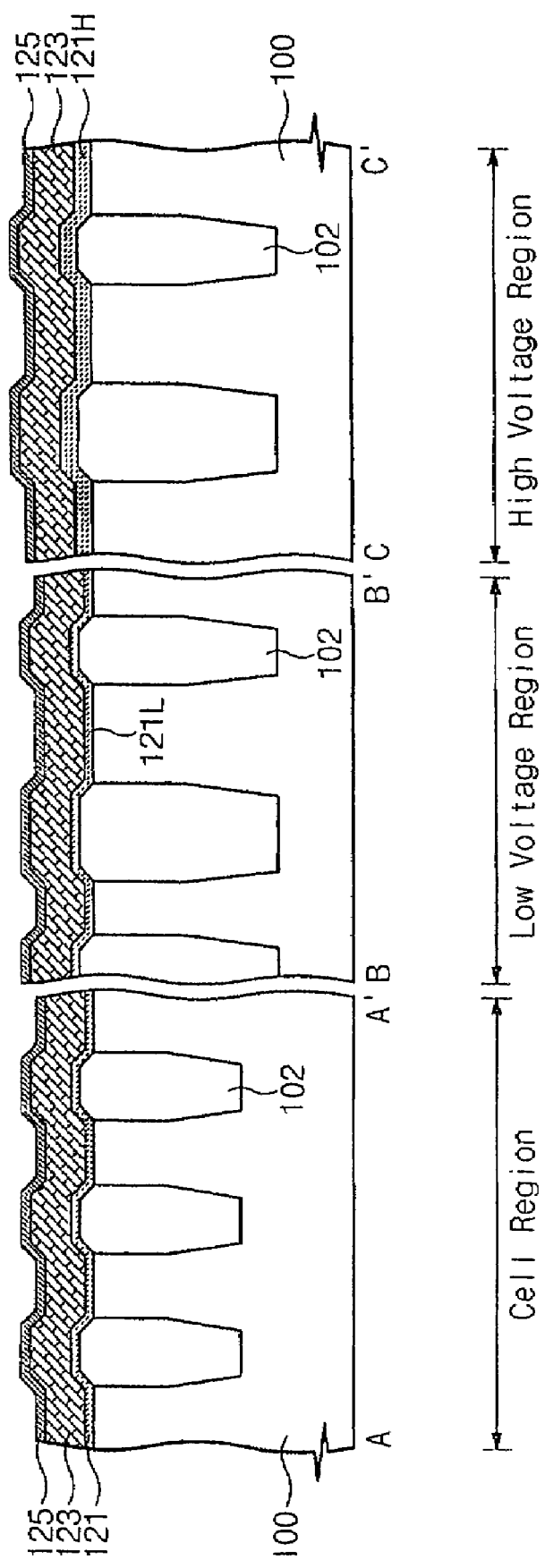
FIGS. 4 through 9 illustrate cross-sectional views of stages in an exemplary method of fabricating a nonvolatile memory device according to one or more aspects the present invention, taken along lines A-A', B-B' and C-C' of FIG. 1.

Referring to FIG. 4, a cell region and a peripheral region may be defined in a semiconductor substrate 100. The cell region and the peripheral region may be defined based on a design of the nonvolatile memory device. The peripheral circuit region may include a low voltage region and a high voltage region. The device isolation layer 102 may be formed in the semiconductor substrate 100 to define an active region 110. An insulating layer 121 may be formed on the semiconductor substrate 100. The insulating layer 121 may include a low voltage insulating layer 121L of the low voltage region and a high voltage insulating layer 121H of the high voltage region. In the following description, the low voltage insulating layer 121H and the high voltage insulating layer 121H may be represented as the insulating layer 121. The low voltage insulating layer 121L may have a thickness that is smaller than a thickness of the high voltage insulating layer 121H. Such low and high voltage insulating layers 121L and 121H having different thicknesses may be formed by conventional process(es). For example, a high voltage insulating layer (not shown) may be formed on the semiconductor substrate 100. The high voltage insulating layer on the low voltage region may then be etched to expose the semiconductor substrate of the low voltage region. Then, a low voltage insulating layer (not shown) may be formed on the semiconductor substrate 100 of the low voltage region.

A semiconductor layer 123 may be formed on the semiconductor substrate 100 on which the insulating layer 121 formed. An ohmic layer 125 may be formed on the semiconductor layer 123. The semiconductor layer 123 may be, e.g., a polysilicon layer. The ohmic layer 125 may be, e.g., a metallic silicide layer. The ohmic layer 125 may include, e.g., WSi, TiSi, TaSi and/or CoSi.

Figure 5:
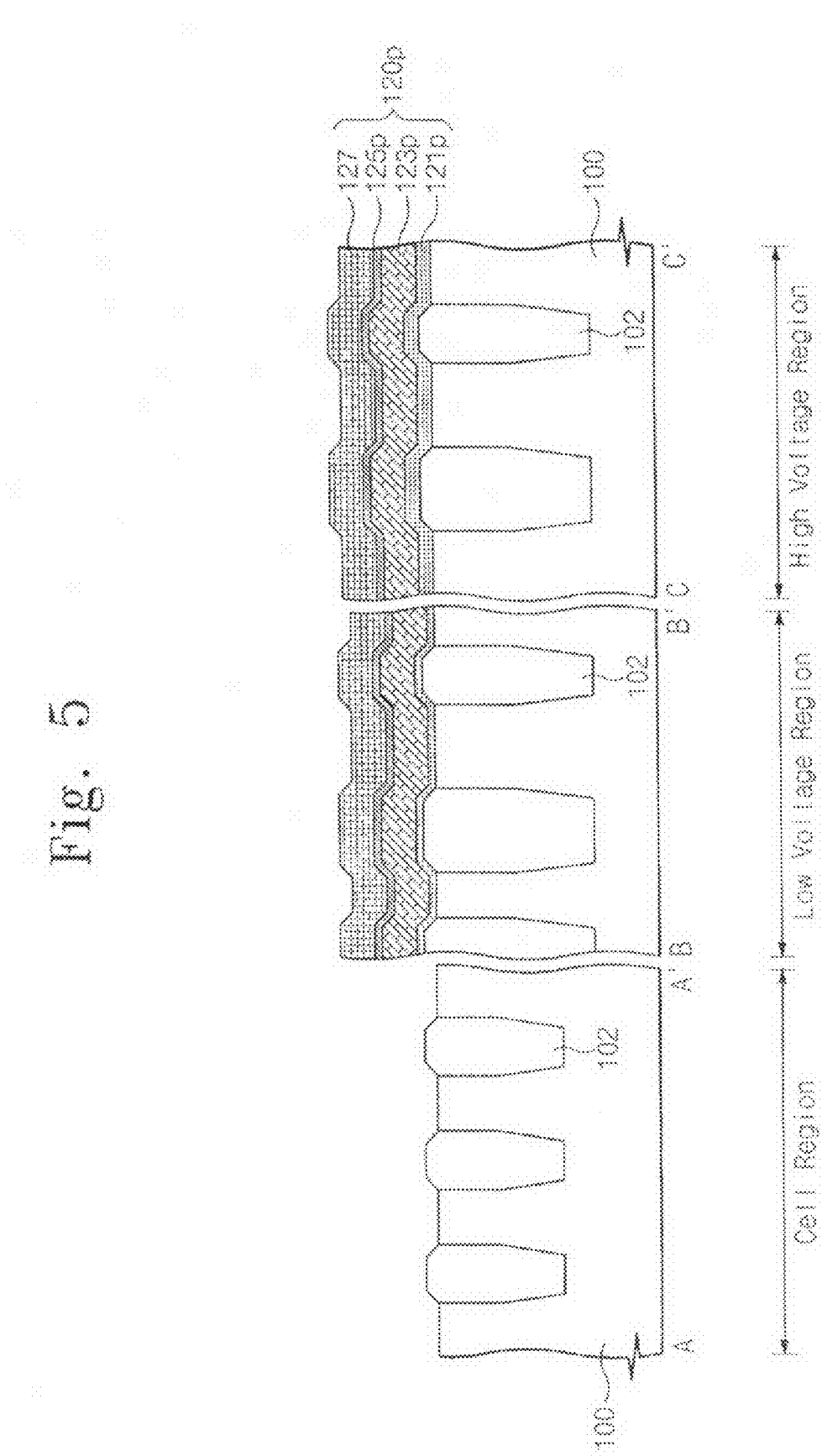

Referring to FIGS. 4 and 5, a first mask layer (not shown) may be formed on the ohmic layer 125. The first mask layer may include, e.g., a silicon oxide layer or a silicon nitride layer. The first mask layer of the cell region may be removed through a patterning process to thereby form a first mask pattern 127. The exposed portion(s) of the ohmic layer 125, the semiconductor layer 123 and the insulating layer 121 on the cell region may be removed using the first mask pattern 127 as an etch mask, thereby forming an ohmic pattern 125p, a semiconductor pattern 123p, and an insulating pattern 121p. As shown in FIG. 5, in the cell region, the semiconductor substrate 100 may be exposed, and in the peripheral region, a peripheral gate pattern 120p may be formed. The peripheral gate pattern 120p may include the insulating pattern 121p, the semiconductor pattern 123p on the insulating pattern 121p, the ohmic pattern 125p on the semiconductor pattern 123p, and the first mask pattern 127 on the ohmic pattern 125p.

Figure 6:
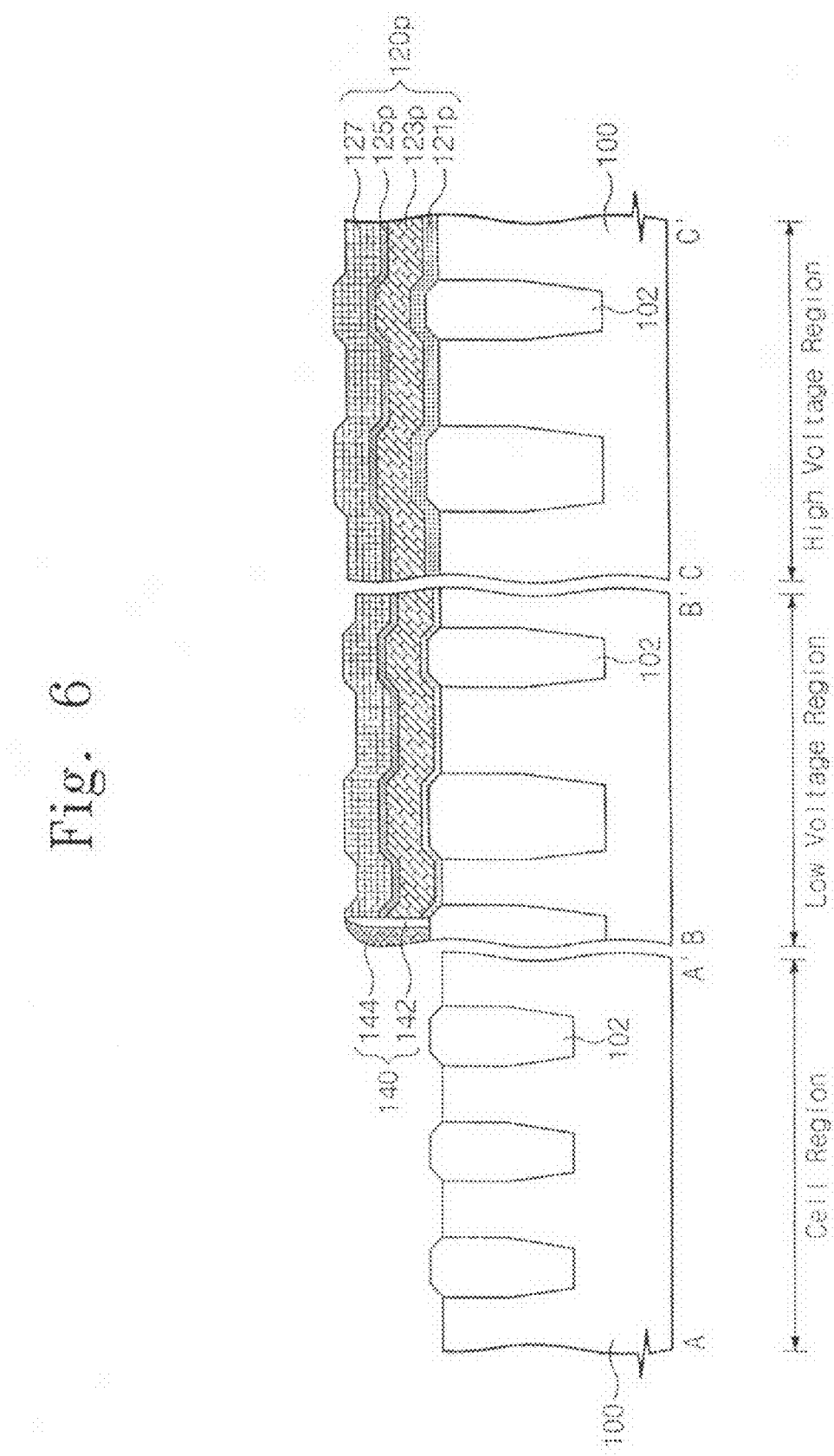

Referring to FIG. 6, the sidewall insulating layer 140 may be formed on a sidewall of the peripheral gate pattern 120p, between the peripheral circuit region and the cell region. The sidewall insulating layer 140 may include, e.g., an oxygen diffusion barrier layer that prevents some or all oxygen from diffusing into the peripheral gate pattern 120p. The sidewall insulating layer 140 may be formed using, e.g., the following procedure. A silicon oxide layer may be formed on the semiconductor substrate 100 including the cell region where the layers, e.g., the ohmic layer 125, the semiconductor layer 123 and the insulating layer 121, may have been removed and the peripheral circuit gate pattern 120p. A silicon nitride layer may be formed on the silicon oxide layer. The silicon oxide layer and the silicon nitride layer may be anisotropically etched to form the sidewall insulating layer 140. Referring to FIG. 6, in embodiments of the invention, the sidewall insulating layer 140 may include, e.g., the silicon oxide layer 142 and the silicon nitride layer 144.

Figure 7:
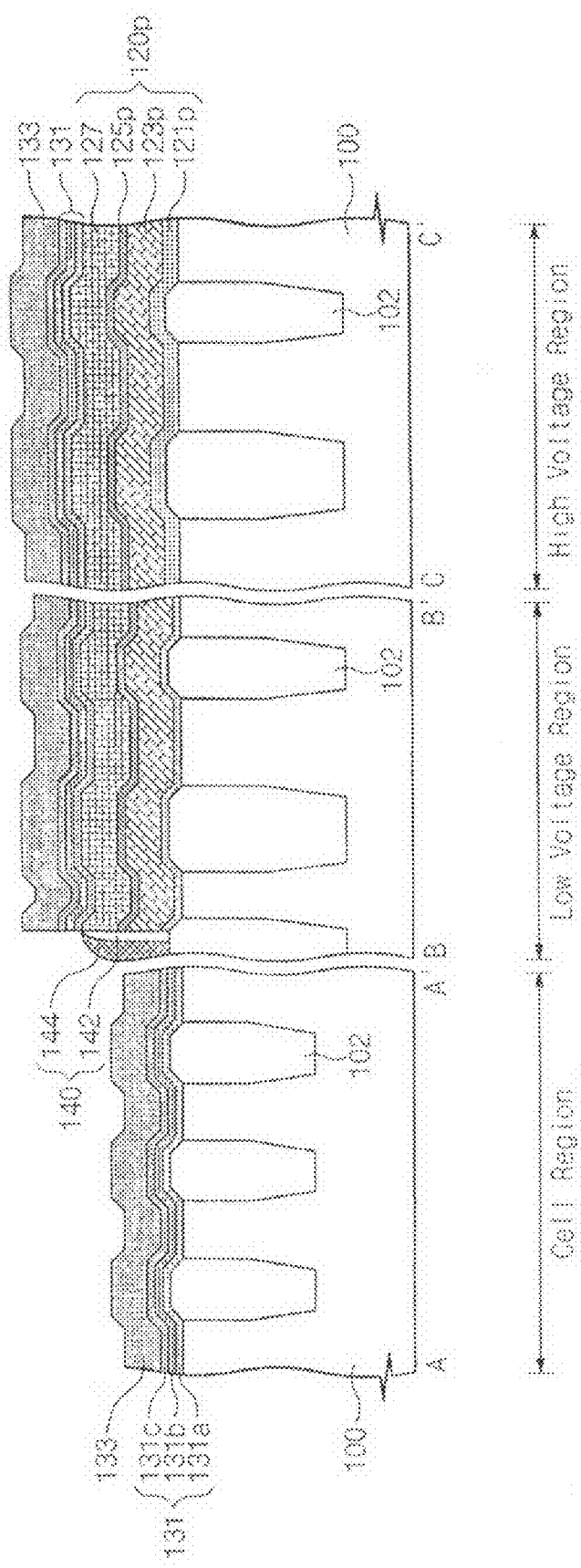

Referring to FIG. 7, a charge storage insulating layer 131 may be formed on the semiconductor substrate 100, and a gate conductive layer 133 may be formed on the charge storage insulating layer 131. The charge storage insulating layer 131 may include, e.g., a tunnel insulating layer 131a, a charge storage layer 131b, and a blocking insulating layer 131c. The tunnel insulating layer 131a and the blocking insulating layer 131c may include, e.g., silicon oxide, silicon nitride, aluminum oxide ($Al_2O_3$), hafnium aluminate (HfAlO), HfAlON, hafnium silicate (HfSiO) and/or hafnium silicon oxynitride (HfSiON). The blocking insulating layer 131c may include, e.g., an insulating layer having a dielectric constant that is greater than a dielectric constant of a highest-k insulating layer of the tunnel insulating layer 131a. In some embodiments of the invention, the blocking insulating layer 131c may have a thickness that is greater than a thickness of the highest-k insulating layer of the tunnel insulating layer 131a. The charge storage layer 131b may include, e.g., polysilicon, silicon nitride ($Si_3N_4$), nano crystalline silicon, nano crystalline silicon germanium, nano crystalline metal, aluminum oxide ($Al_2O_3$), hafnium oxide ($HfO_2$), hafnium aluminate (HfAlO) and/or hafnium silicon oxynitride (HfSiON).

The gate conductive layer 133 may include, e.g., a material having a work function greater than 4 eV. A potential barrier between the gate conductive layer 133 and the charge storage insulating layer 131 may be increased. For example, the gate conductive layer 133 may include, e.g., a semiconductor doped with p-type dopant, tantalum nitride (TaN), tantalum (Ta), ruthenium (Ru), tungsten nitride (WN), tungsten (W), titanium (Ti), titanium nitride (TiN), tantalum titanium (TaTi), tantalum platinum (TaPt), tantalum silicon nitride (TaSiN), hafnium nitride (HfN), titanium aluminum nitride ($Ti_2AlN$), molybdenum (Mo) and/or platinum (Pt).

Figure 8:
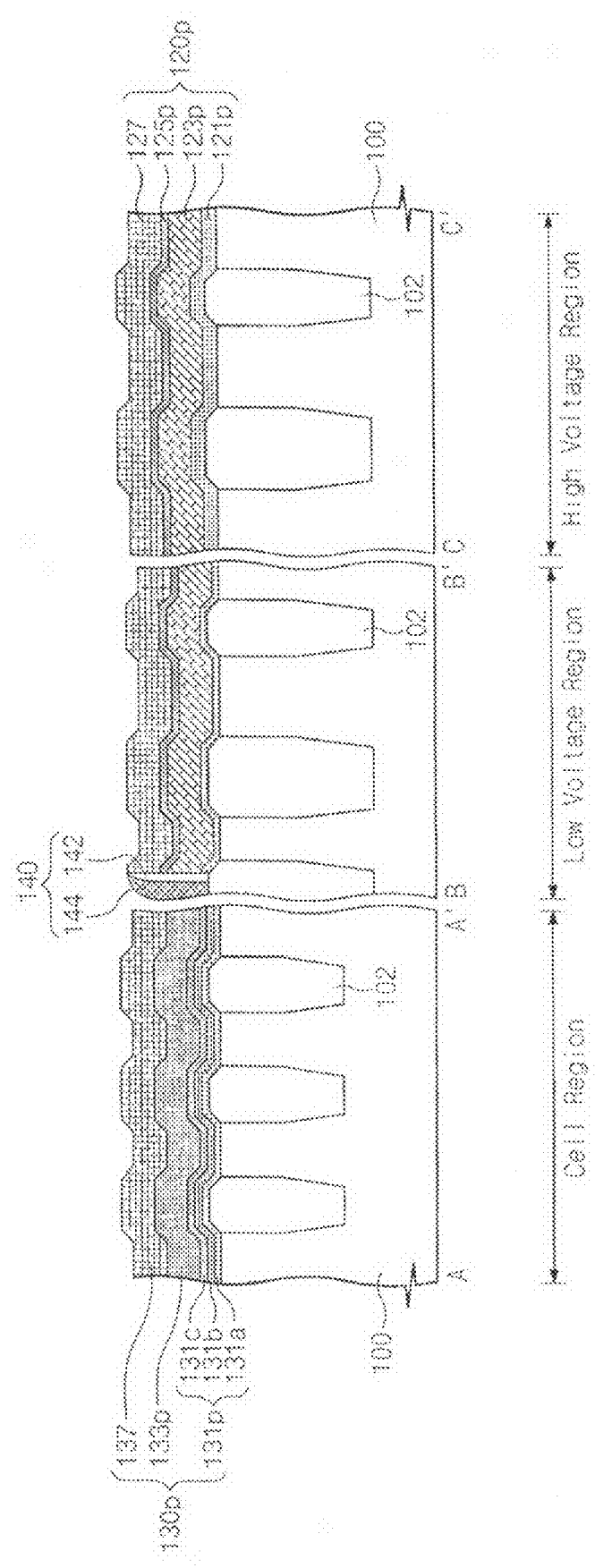

Referring to FIG. 8, a second mask pattern 137 may be formed on the gate conductive layer 133 so as to cover the cell region. As shown in FIG. 8, using the second mask pattern 137, exposed portion(s) of the gate conductive layer 133 and the charge storage layer 131 may be removed. More particularly, e.g., the gate conductive layer 133 and the charge storage insulating layer 131 may be patterned using the second mask pattern 137 as an etch mask so that the first mask pattern 127 over the peripheral region may be exposed, and a charge storage insulating pattern 131p and a gate pattern 133p may be formed in the cell region. The gate pattern 133p may be formed on the charge storage insulating pattern 131p. Thus, a cell gate pattern 130p may be formed in the cell region. At this stage, the cell gate pattern 130p may include, e.g., the charge storage insulating pattern 131p, the gate pattern 133p on the charge storage insulating pattern 131p, and the second mask pattern 137 on the gate pattern 133p.

Figure 9:
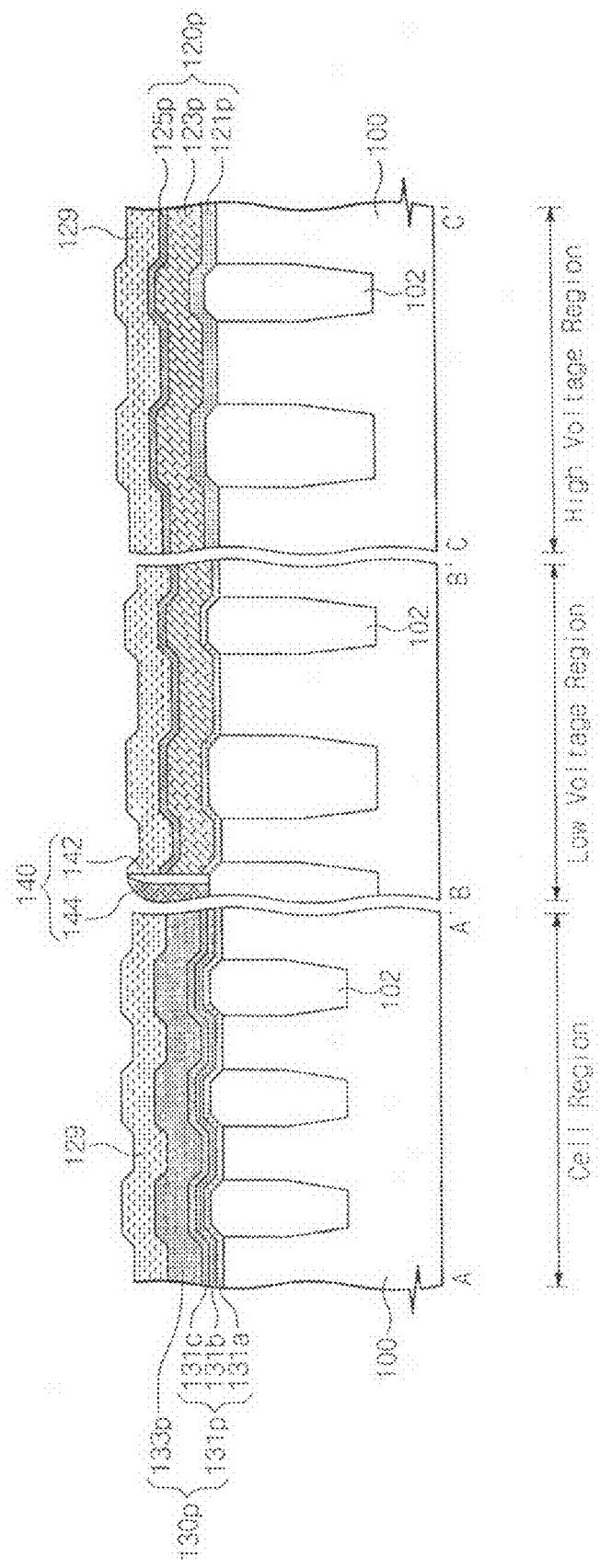

Referring to FIG. 9, the first and second mask patterns 127 and 137 may then be removed to expose the ohmic pattern 125p and the gate pattern 133p. A conductive layer 129 may be formed on the exposed ohmic pattern 125p and the gate pattern 133p. The conductive layer 129 may include, e.g., a lower conductive layer (not shown) and an upper conductive layer (not shown). The lower conductive layer may include, e.g., a metallic nitride, a conductive metallic oxide, and/or a metallic nitride having Si or Al. The metallic nitride may include, e.g., TaN, TiN and/or WN. The metallic oxide may include, e.g., $IrO_2$ and/or $RuO_2$. The metallic nitride having Si or Al may include, e.g., TiSiN, TaSiN, TaAlN and/or TiAlN. The upper preliminary conductive layer may include, e.g., tungsten (W), copper (Cu), aluminum (Al), gold (Au), silver (Ag), platinum (Pt), and palladium (Pd). For example, the conductive layer 129 may include a tungsten nitride layer and a tungsten layer on the tungsten nitride layer.

Then, the peripheral gate pattern 120p, the cell gate pattern 130p, and the conductive layer 129 illustrated in FIG. 9 may be patterned to form, as shown in FIG. 2, the peripheral gate pattern(s) 120L, 120H over the peripheral circuit region, and the cell gate pattern(s) 130 over the cell region. In the peripheral circuit region, the gate insulating layers 122L and 122H, the semiconductor layers 124L and 124H, the ohmic layers 126L and 126H and the conductive layers 128L and 128H of the peripheral gates 120L, 120H may be formed. In the cell region, the charge storage insulating layer 132, the gate electrode 134, and the conductive layer 136 of the cell gate 130 may be formed.

The sidewall spacers 114 may be formed on sidewalls of the cell gate 130. The sidewall spacers 116 may be formed on sidewalls of the peripheral circuit gate. The sidewall spacers 114 and 116 may include, e.g., a medium temperature oxide layer and a silicon nitride layer. Impurity regions 112 of source/drain regions may be provided in the semiconductor substrate 100 at both sides of the gates 120L, 120H, 130, as can be seen in FIG. 3.

Embodiments of the invention provide a cell gate and a peripheral gate including different elements, e.g., layers, by forming the cell gate of the cell region and the peripheral gate of the peripheral circuit region using different fabrication processes. Therefore, it is possible to overcome an increase of an interface resistance owing to non-ohmic contact by forming an ohmic layer only in the peripheral circuit region, and simultaneously overcome property degradation of the cell gate because the ohmic layer is not disposed on the cell gate of the cell region.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A nonvolatile memory device, comprising:
a semiconductor substrate including a cell region and a peripheral circuit region;
a cell gate on the cell region; and
a peripheral circuit gate on the peripheral circuit region, wherein:
the cell gate includes a charge storage insulating layer on the semiconductor substrate, a gate electrode on the charge storage insulating layer, and a conductive layer on the gate electrode,
the peripheral circuit gate includes a gate insulating layer on the semiconductor substrate, a semiconductor layer on the gate insulating layer, an ohmic layer on the semiconductor layer, and the conductive layer on the ohmic layer, and
the cell gate does not include the ohmic layer.

2. The nonvolatile memory device as claimed in claim 1, wherein the charge storage insulating layer includes a tunnel insulating layer, a charge storage layer and a blocking insulating layer.

3. The nonvolatile memory device as claimed in claim 2, wherein the charge storage layer includes at least one of silicon nitride ($Si_3N_4$), nano crystalline silicon, nano crystalline silicon germanium, nano crystalline metal, aluminum oxide ($Al_2O_3$), hafnium oxide ($HfO_2$), hafnium aluminate (HfAlO), and hafnium silicon oxynitride (HfSiON).

4. The nonvolatile memory device as claimed in claim 2, wherein the blocking insulating layer includes a material having a dielectric constant greater than that of the tunnel insulating layer.

5. The nonvolatile memory device as claimed in claim 1, wherein the gate electrode comprises a metal having a work function greater than 4 eV.

6. The nonvolatile memory device as claimed in claim 5, wherein the gate electrode includes at least one of tantalum nitride (TaN), tantalum (Ta), ruthenium (Ru), tungsten nitride (WN), tungsten (W), titanium (Ti), titanium nitride (TiN), tantalum titanium (TaTi), tantalum platinum (TaPt), tantalum silicon nitride (TaSiN), hafnium nitride (HfN), titanium aluminum nitride ($Ti_2AlN$), molybdenum (Mo), and platinum (Pt).

7. The nonvolatile memory device as claimed in claim 1, wherein the semiconductor layer includes a polysilicon layer.

8. The nonvolatile memory device as claimed in claim 1, wherein the ohmic layer includes a metal silicide layer.

9. The nonvolatile memory device as claimed in claim 1, wherein the conductive layer includes at least one of a metal nitride layer and a tungsten nitride layer with a tungsten layer thereon.

10. The nonvolatile memory device as claimed in claim 1, further comprising a sidewall spacer on a sidewall of the peripheral circuit gate.

11. The nonvolatile memory device as claimed in claim 10, wherein the sidewall spacer includes at least one of a silicon oxide layer and a silicon nitride layer.

* * * * *